(12) United States Patent
Kim

(10) Patent No.: US 10,901,313 B2
(45) Date of Patent: Jan. 26, 2021

(54) DIVISION MASK

(71) Applicant: SAMSUNG DISPLAY CO., LTD., Yongin-si (KR)

(72) Inventor: Minyoung Kim, Jeonju-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 4 days.

(21) Appl. No.: 15/700,256

(22) Filed: Sep. 11, 2017

(65) Prior Publication Data
US 2018/0074394 A1    Mar. 15, 2018

(30) Foreign Application Priority Data

Sep. 12, 2016 (KR) .......................... 10-2016-0117412

(51) Int. Cl.
| | | |
|---|---|---|
| G03F 1/20 | (2012.01) | |
| H01L 27/15 | (2006.01) | |
| C23C 14/04 | (2006.01) | |
| H01L 51/56 | (2006.01) | |
| B05C 21/00 | (2006.01) | |

(52) U.S. Cl.
CPC .............. *G03F 1/20* (2013.01); *B05C 21/005* (2013.01); *C23C 14/042* (2013.01); *H01L 27/156* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 8,915,213 B2 | 12/2014 | Park | |
| 8,925,480 B2 | 1/2015 | Kim | |
| 9,039,478 B2 | 5/2015 | Kim et al. | |
| 9,346,078 B2 | 5/2016 | Oh et al. | |
| 9,567,662 B2 | 2/2017 | Kim | |
| 2012/0266813 A1* | 10/2012 | Hong ................... | C23C 14/042 |
| | | | 118/504 |
| 2012/0279444 A1* | 11/2012 | Hong ................... | C23C 14/042 |
| | | | 118/504 |

FOREIGN PATENT DOCUMENTS

| | | |
|---|---|---|
| KR | 10-0941007 | 2/2010 |
| KR | 10-2012-0080857 | 7/2012 |
| KR | 10-2012-0123918 | 11/2012 |
| KR | 10-2012-0125038 | 11/2012 |
| KR | 10-2014-0052707 | 5/2014 |
| KR | 10-2014-0070255 | 6/2014 |

* cited by examiner

*Primary Examiner* — Jethro M. Pence
(74) *Attorney, Agent, or Firm* — F. Chau & Associates, LLC

(57) ABSTRACT

A division mask includes a main body portion including an opening pattern; and a clamping portion disposed at opposite ends of the main body portion. The clamping portion including at least three branch portions. The branch portions have a smaller width in a direction away from a central line of the division mask.

19 Claims, 11 Drawing Sheets

DIVISION MASK

CROSS-REFERENCE TO RELATED APPLICATION

This application claims priority under 35 U.S.C. § 119 to Korean Patent Application No. 10-2016-0117412, filed on Sep. 12, 2016 in the Korean Intellectual Property Office, the contents of which is incorporated by reference herein in its entirety.

TECHNICAL FIELD

Exemplary embodiments of the present invention relate to a division mask.

DISCUSSION OF RELATED ART

Organic light-emitting diode ("OLED") display devices are a type of self-luminous display device. OLED display devices display an image using an OLED that emits light. The OLED display devices do not require a separate light source. Liquid crystal display ("LCD") devices include a separate light source. Thus, OLED display devices are relatively thin and light. The OLED display devices have characteristics of relatively low power consumption, relatively high luminance, and relatively high response speed. Accordingly, OLED display devices may be used in portable electronic devices.

The OLED display devices have a stacked structure. The stacked structure includes a light emitting layer disposed between an anode and a cathode. Holes and electrons respectively injected into the anode and the cathode recombine to emit light in the light emitting layer. Therefore, colors may be realized. However, since it may be relatively difficult to obtain a relatively high-efficiency light emission in the above-described structure, intermediate layers such as an electron injection layer, an electron transport layer, a hole transport layer, and a hole injection layer are further disposed between the electrode and the light emitting layer.

The electrodes, the light emitting layer, and the intermediate layer of the OLED display device may be formed by various methods, for example, a deposition method. In the deposition method to manufacture an OLED display device, a fine metal mask ("FMM") is used. The FMM has a substantially same pattern as a pattern of a thin film to be formed on a substrate. The FMM is aligned above the substrate. A thin film forming material is deposited thereon such that the thin film is patterned on the substrate.

When such a FMM is relatively large, an etching error for pattern formation may be relatively large. A central portion of the mask may sag due to its own weight. Accordingly, a mask frame assembly may be used in which a plurality of stick-shaped division masks are attached to a frame. When such a division mask is attached to the frame, a tensile force acts in the longitudinal direction of the division mask. Accordingly, waves may be generated in the division mask.

SUMMARY

Exemplary embodiments of the invention provide a division mask able to substantially prevent waves of the division mask.

Exemplary embodiments of the present invention provide a division mask. The division mask includes a main body portion; and a clamping portion. The clamping portion is disposed at opposite ends of the main body portion. The clamping portion includes at least three branch portions. The branch portions have a smaller width further away from a central line of the division mask.

The clamping portion may include a clamping portion including four branch portions.

The clamping portion may include a clamping portion including five branch portions.

The main body portion and the clamping portion may each include a metal.

The main body portion and the clamping portion may each include an invar alloy.

The clamping portion may be bilaterally symmetric.

The main body portion may further include an opening pattern.

The branch portions may define a U-shaped groove.

The division mask may further include a joint portion. The joint portion may be disposed between the clamping portion and the main body portion.

Each of the branch portions may have a smaller width further away from the main body portion.

The branch portion may define a hemispherically shaped groove.

Exemplary embodiments of the present invention provide a division mask. The division mask includes a main body portion and a clamping portion. The main body portion includes an opening pattern disposed along a longitudinal direction of the main body portion. The clamping portion is disposed at opposite ends of the main body portion. The clamping portion includes at least three branch portions. Each of the at least three branch portions has a smaller width further away from a central line of the division mask. The clamping portion is bilaterally symmetric.

The at least three branch portions may define a U-shaped groove.

The main body portion and the clamping portion may each include a metal.

The division mask may further include a joint portion. The joint portion may be disposed between the main body and the clamping portion.

Exemplary embodiments of the present invention provide a division mask. The division mask includes a main body portion and a clamping portion. The clamping portion is disposed at opposite ends of the main body portion. The clamping or portion includes a plurality of branch portions. Each of the plurality of branch portions has a smaller width further from a central line of the division mask.

The plurality of branch portions may define a U-shaped groove.

The division mask may further include a joint portion. The joint portion may be disposed between the clamping portion and the main body portion.

BRIEF DESCRIPTION OF THE DRAWINGS

The above and other features and aspects of the present disclosure of invention will be more apparent by describing in detail exemplary embodiments thereof with reference to the accompanying drawings, in which.

DETAILED DESCRIPTION OF THE EMBODIMENTS

Figure 1:
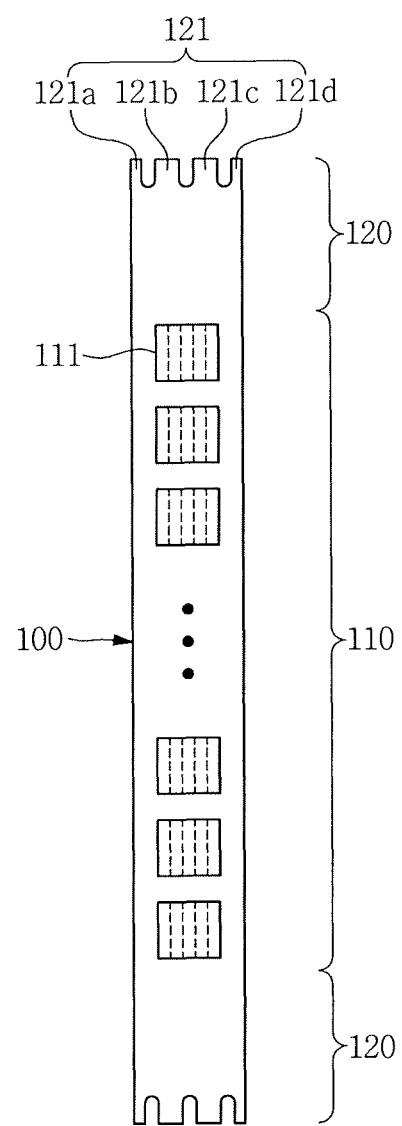
FIG. 1 is a plan view illustrating a division mask according to an exemplary embodiment of the present invention.

Exemplary embodiments of the present invention will be described below in more detail with reference to the accompanying drawings. In this regard, the exemplary embodiments may have different forms.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It is to be understood that while parameters may be described herein as having "about" a certain value, according to exemplary embodiments, the parameter may be exactly the certain value or approximately the certain value as would be understood by a person having ordinary skill in the art.

It will be understood that when a component, such as a layer, a film, a region, or a plate, is referred to as being "on" another component, the component can be directly on the other component or intervening components may be present.

Hereinafter, a division mask according to an exemplary embodiment of the present invention will be described in detail with reference to FIGS. 1, 2A, 2B, 3, 4A, 4B, and 5.

Figure 2A:
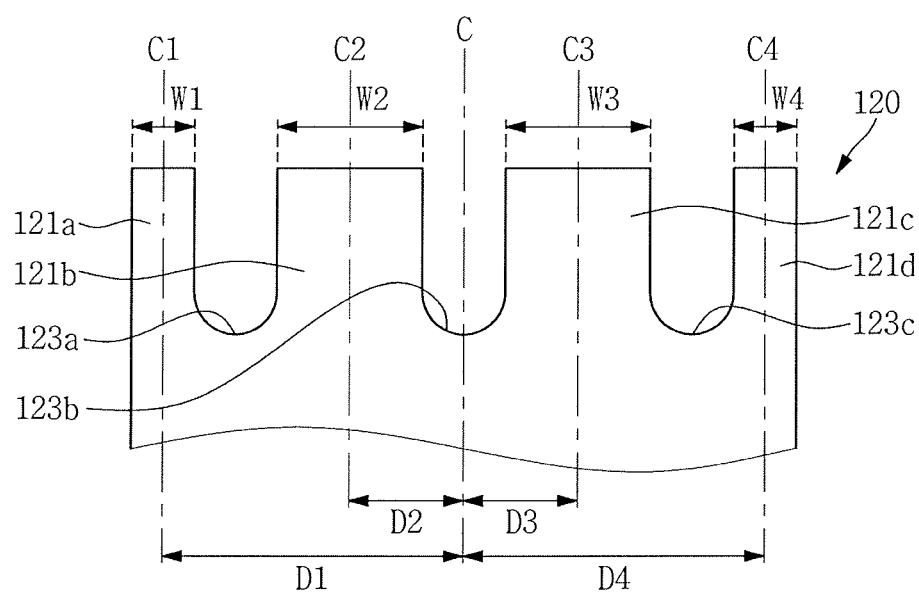
FIGS. 2A and 2B are enlarged views illustrating a clamping portion of the division mask according to an exemplary embodiment of the present invention.
Figure 2B:
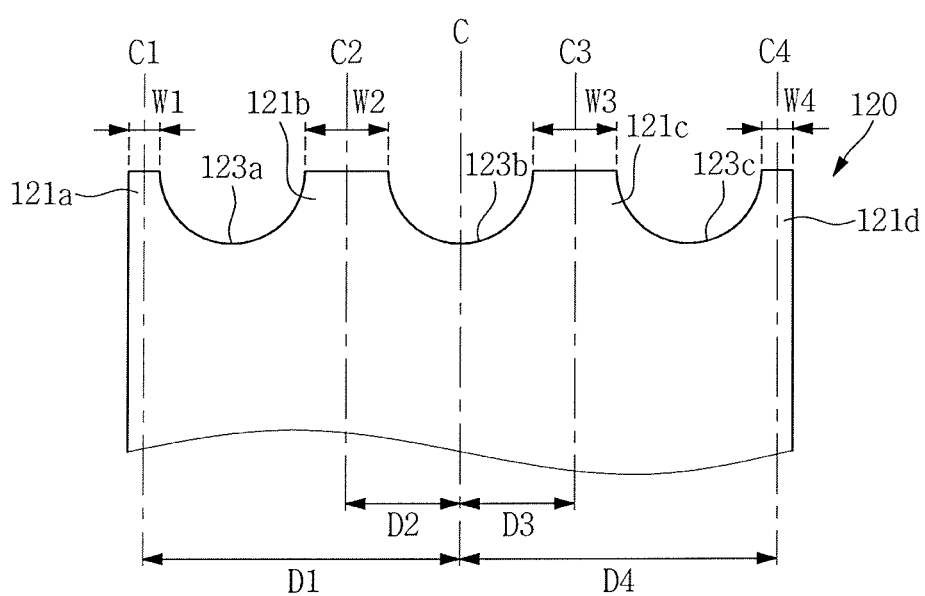

FIG. 1 is a plan view illustrating a division mask according to an exemplary embodiment of the present invention. FIGS. 2A and 2B are enlarged views illustrating a clamping portion of the division mask according to an exemplary embodiment of the present invention.

Referring to FIG. 1, the division mask 100 may include a main body portion 110 and a clamping portion 120.

The division mask 100 may include a metal such as nickel (Ni), cobalt (Co), a nickel alloy, a nickel-cobalt alloy, stainless steel (SUS), and/or an invar alloy.

The main body portion 110 may include an opening pattern 111. The opening pattern 111 may be disposed along a longitudinal direction of the division mask 100. Each opening pattern 111 may include a plurality of fine opening patterns. Each of the plurality of fine opening patterns may be defined in a shape corresponding to a shape of a thin film to be deposited on a substrate disposed above the plurality of division masks 100. Accordingly, in a deposition process, a deposition material may be deposited on the substrate through the opening pattern 111, for example, to form a desired shape of the thin film. The opening pattern 111 may be quadrangular in shape; however, exemplary embodiments of the present invention are not limited thereto. The opening pattern 111 may have various shapes.

The clamping portion 120 may be disposed at opposite ends of the main body portion 110. The clamping portion 120 may include at least three branch portions 121.

The clamping portion 120 may include four branch portions 121. For example, the clamping portion 120 may include a first branch portion 121a, a second branch portion 121b, a third branch portion 121c, and a fourth branch portion 121d. Referring to FIGS. 2A and 2B, when a line extending along the center of the division mask 100 is defined as a central line C of the division mask 100, a distance between the central line C of the division mask 100 and a line C1 extending along the center of the first branch portion 121a may be defined as a first distance D1. A distance between the central line C of the division mask 100 and a line C2 extending along the center of the second branch portion 121b may be defined as a second distance D2. A distance between the central line C of the division mask 100 and a line C3 extending along the center of the third branch portion 121c may be defined as a third distance D3. A distance between the central line C of the division mask 100 and a line C4 extending along the center of the fourth branch portion 121d may be defined as a fourth distance D4. In such an exemplary embodiment of the present invention, the first distance D1 may be substantially the same as the fourth distance D4 (D1=D4). The second distance D2 may be substantially the same as the third distance D3 (D2=D3). The first and fourth distances D1 and D4 may be greater than the second and third distances D2 and D3 (D1 and D4<D2 and D3).

The clamping portion 120 may be bilaterally symmetric. For example, the first branch portion 121a may have a substantially same shape as a shape of the fourth branch portion 121d. The second branch portion 121b may have a substantially same shape as a shape of the third branch portion 121c. For example, as described above, the first distance D1, which may be a distance at which the first branch portion 121a is spaced apart from the central line C, may be substantially the same as the fourth distance D4, which may be a distance at which the fourth branch portion 121d is spaced apart from the central line C (D1=D4). The second distance D2, which may be a distance at which the second branch portion 121b is spaced apart from the central line C, may be substantially the same as the third distance D3, which may be a distance at which the third branch portion 121d is spaced apart from the central line C (D2=D3). In addition, the first branch portion 121a may have a substantially same width as a width of the fourth branch portion 121d (W1=W4). The second branch portion 121b may have a substantially same width as a width of the third branch portion 121c (W2=W3). Accordingly, a tensile force may act uniformly on the right and left side of the division mask 100, for example, to reduce occurrence of waves.

Each of the branch portions 121a, 121b, 121c, and 121d may have a gradually decreasing width along a direction away from the center of the division mask 100. For example, the first branch portion 121a and the fourth branch portion 121d further away from the central line C of the division mask 100 than the second branch portion 121b and the third branch portion 121c may have a smaller width than a width of the second branch portion 121b and the third branch portion 121c. The width W1 and W4 of the first branch portion 121a and the fourth branch portion 121d may be smaller than the width W2 and W3 of the second branch portion 121b and the third branch portion 121c (W1 and W4<W2 and W3).

The plurality of branch portions 121 may define a plurality of grooves 123a, 123b, and 123c. For example, as illustrated in FIGS. 2A and 2B, the first branch portion 121a and the second branch portion 121b may define a first groove 123a. The second branch portion 121b and the third branch portion 121c may define a second groove 123b. The third branch portion 121c and the fourth branch portion 121d may define a third groove 123c. Each of the grooves 123a, 123b, and 123c may be defined in a U-like shape as illustrated in FIG. 2A. Alternatively, as illustrated in FIG. 2B, each of the grooves 123a, 123b, and 123c may be defined in a hemispherical shape. When the grooves 123a, 123b, and 123c are defined in the hemispherical shape, each of the branch portions 121 may have a smaller width in a direction away from the main body portion 110. However, exemplary embodiments of the present invention are not limited thereto. Each of the grooves 123a, 123b, and 123c may be defined as a curved line or a straight line having a substantially constant inclination.

Figure 3:
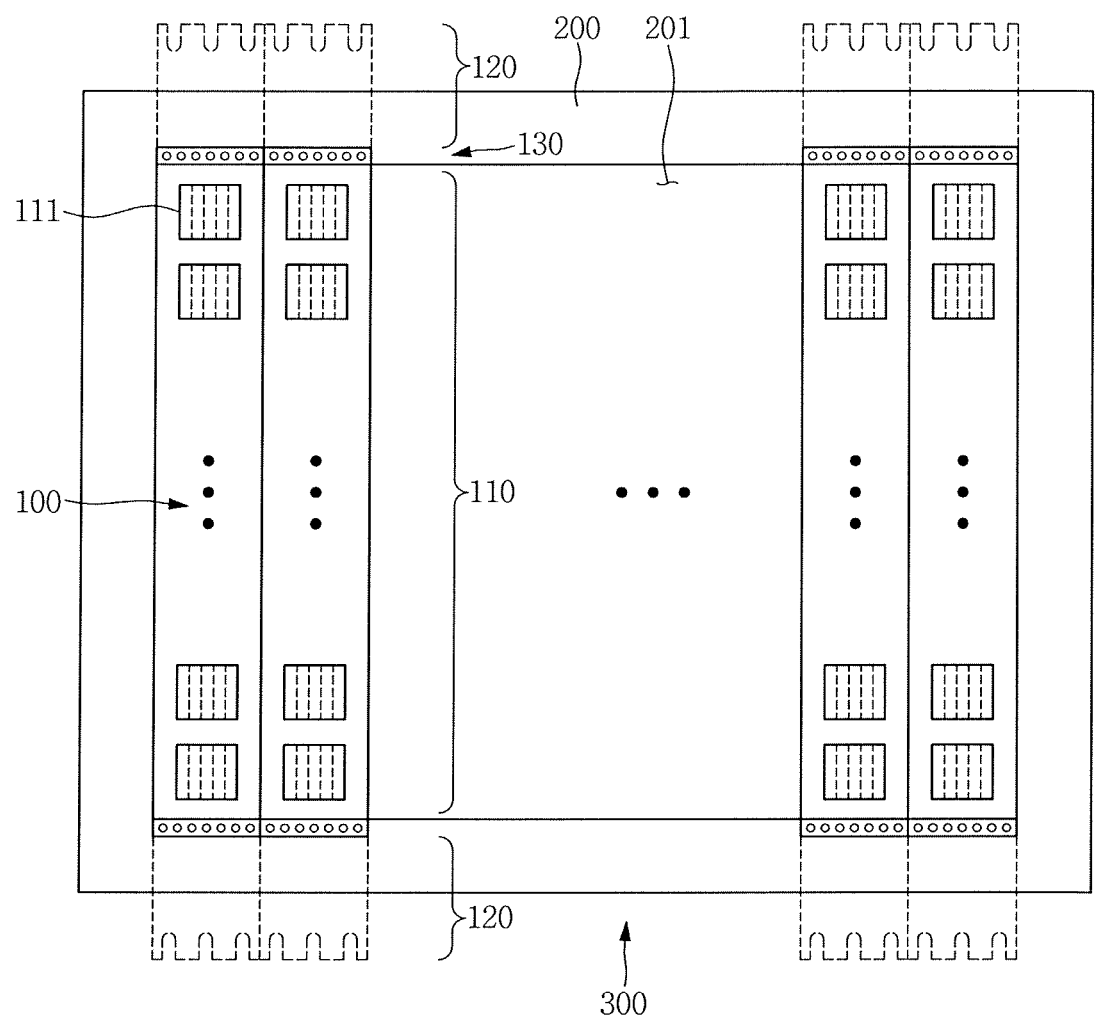
FIG. 3 is a plan view illustrating a mask frame assembly including the division mask according to an exemplary embodiment of the present invention.

FIG. 3 is a plan view illustrating a mask frame assembly including the division mask according to an exemplary embodiment of the present invention.

Referring to FIG. 3, the mask frame assembly 300 may be manufactured by affixing the plurality of division masks 100 to a frame 200. In such an exemplary embodiment of the present invention, the clamping portion 120 of the division mask 100 affixed to the frame 200 may be removed.

The division mask 100 may further include a joint portion 130. The joint portion 130 may be disposed between the main body portion 110 and the clamping portion 120 described above. As illustrated in FIG. 3, the joint portion 130 may be, for example, welded to the frame 200 to affix the division mask 100 to the frame 200. The division mask 100 according to an exemplary embodiment of the present invention may reduce occurrence of waves. Thus, welding defects of the division mask 100 may be reduced.

The frame 200 may include an opening area 201. The opening area 201 may be defined in a center of the frame 200. The frame 200 may have a quadrangular loop shape. At least a portion of the division mask 100 may be disposed on the frame 200. The opening pattern 111 of the division mask 100 may be disposed over the opening area 201.

The frame 200 may include a metal material. The metal material may have a relatively high rigidity. Thus, deformation by compression or heat applied to the frame 200 may be substantially minimized. For example, the frame 200 may include a metal such as stainless steel (SUS).

Figure 4A:
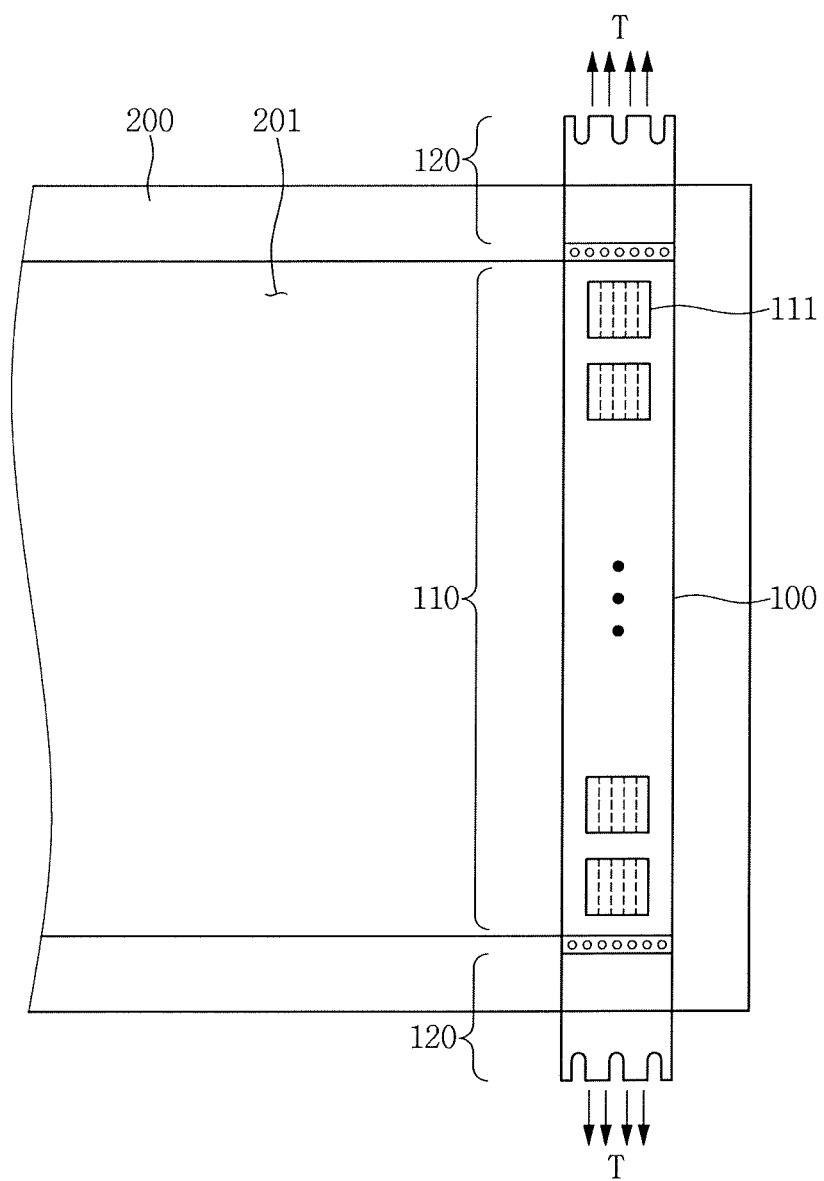
FIGS. 4A and 4B are views illustrating a method of manufacturing the mask frame assembly using the division mask according to an exemplary embodiment of the present invention.
Figure 4B:
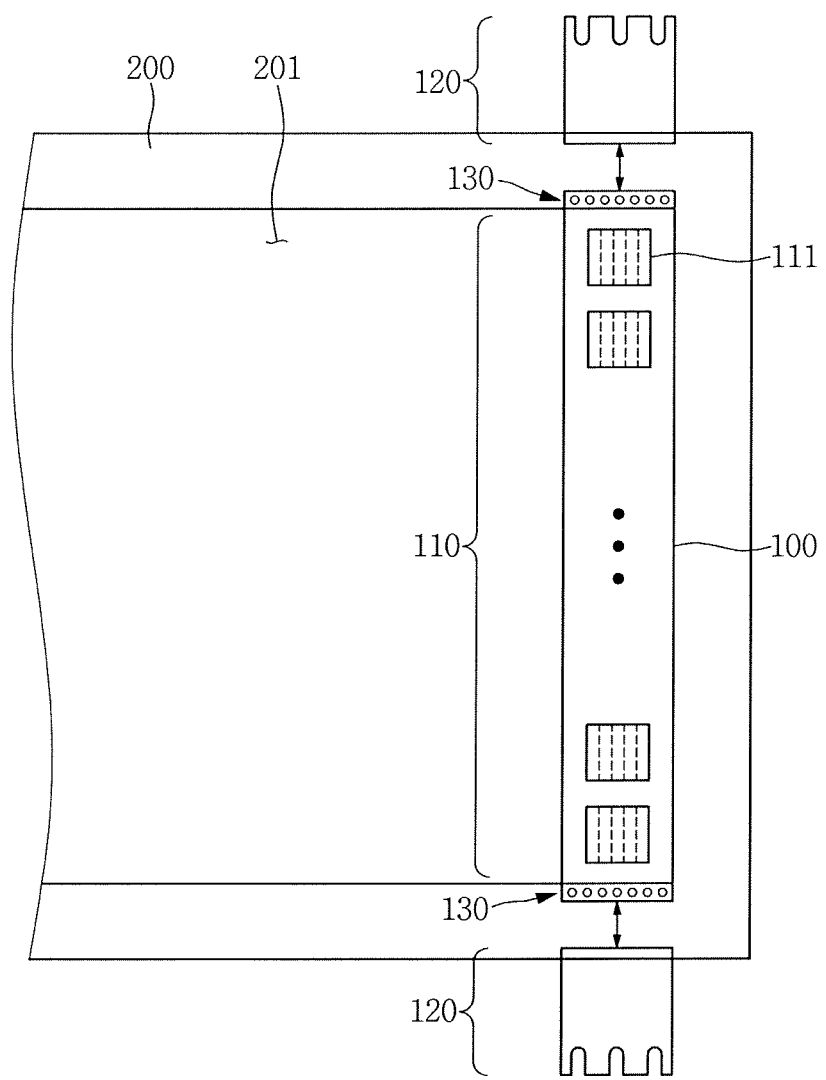

FIGS. 4A and 4B are views illustrating a method of manufacturing a mask frame assembly using the division mask according to an exemplary embodiment of the present invention.

FIG. 4A is a view illustrating a process of fixing the division mask 100 to the frame 200. As illustrated in FIG. 4A, the clamping portion 120 may be held by a tensioning apparatus. A tensile force T may act toward opposite ends of the division mask 100. In such an exemplary embodiment of the present invention, since the branch portion 121 may have a larger width, an area of the main body portion 110 of the division mask 100 subject to the tensile force increases the more adjacent to the central line C of the division mask 100. Accordingly, waves and sagging in the division mask 100 may be reduced.

The joint portion 130 may be welded to the frame 200, for example, to affix the division mask 100 to the frame 200.

FIG. 4B is a view illustrating a process of removing the clamping portion 120 according to an exemplary embodiment of the present invention. As illustrated in FIG. 4B, the clamping portion 120 may be cut, for example, to be removed. The manufacturing process illustrated in FIGS. 4A and 4B may be repeated, for example, to affix the plurality of division masks 100 to the frame 200. Accordingly, the mask frame assembly 300 illustrated in FIG. 2 may be manufactured.

Hereinafter, a division mask 100 according to an exemplary embodiment of the present invention will be described in detail with reference to FIGS. 5, 6, and 7. The descriptions related to the division mask 100 may be omitted. It may be assumed that the division mask 100 is similar to or identical to the corresponding division mask described above with reference to the prior figures.

Figure 5:
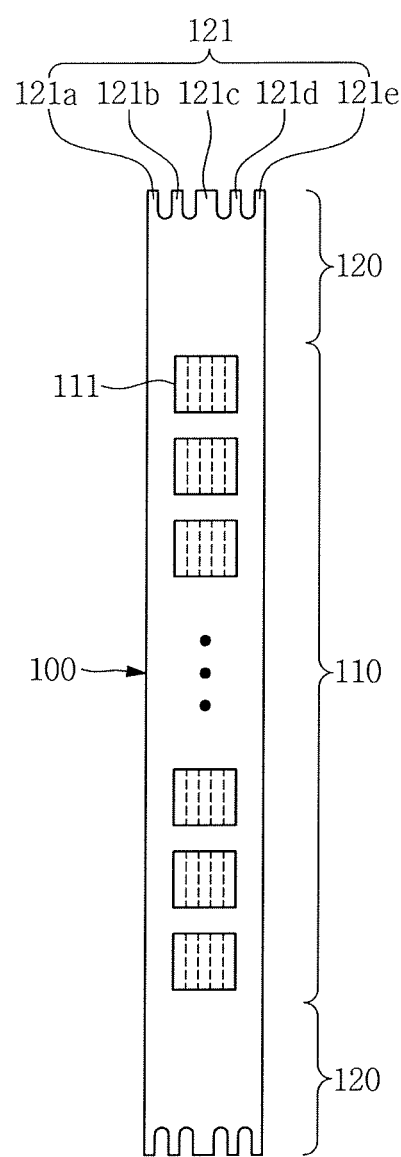
FIG. 5 is a plan view illustrating a division mask according to an alternative exemplary embodiment.
Figure 6:
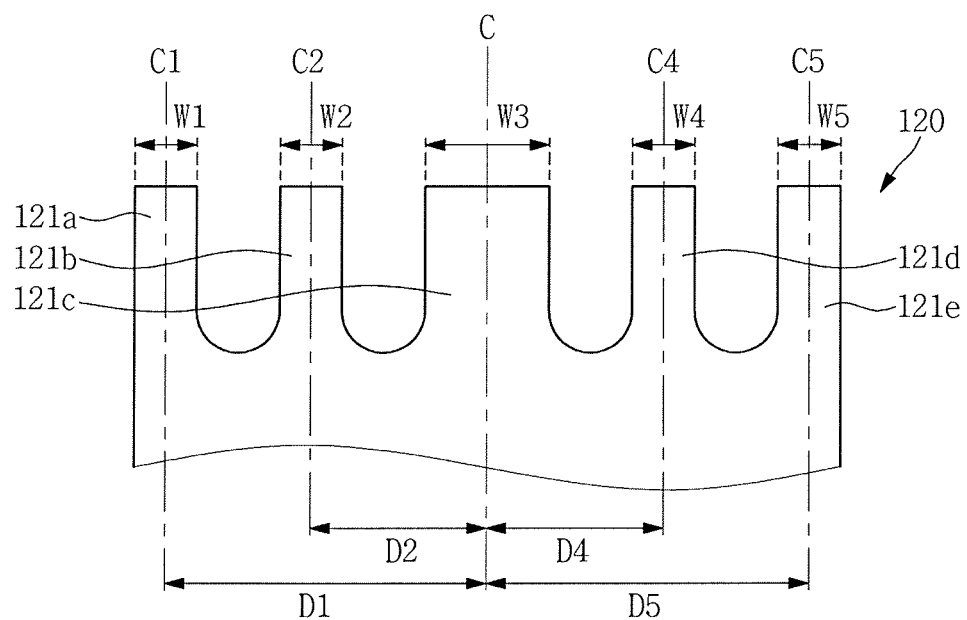
FIG. 6 is an enlarged view illustrating a clamping portion of the division mask according to an exemplary embodiment of the present invention.

FIG. 5 is a plan view illustrating the division mask 100 according to an exemplary embodiment of the present invention. FIG. 6 is an enlarged view illustrating a clamping portion 120 of the division mask 100 according to an exemplary embodiment of the present invention.

Referring to FIG. 5, the clamping portion 120 may include five branch portions 121. For example, the clamping portion 120 may include a first branch portion 121a, a second branch portion 121b, a third branch portion 121c, a fourth branch portion 121d, and a fifth branch portion 121e. Referring to FIG. 6, when a line extending along the center of the division mask 100 is defined as a central line C of the division mask 100, a distance between the central line C of the division mask 100 and a line C1 extending along the center of the first branch portion 121a may be defined as a first distance D1. A distance between the central line C of the division mask 100 and a line C2 extending along the center of the second branch portion 121b may be defined as a second distance D2. A distance between the central line C of the division mask 100 and a line C3 extending along the center of the third branch portion 121c may be defined as a third distance D3. A distance between the central line C of the division mask 100 and a line C4 extending along the center of the fourth branch portion 121d may be defined as a fourth distance D4. A distance between the central line C of the division mask 100 and a line C5 extending along the center of the fifth branch portion 121e may be defined as a fifth distance D5. The first distance D1 may be substantially the same as the fifth distance D5 (D1=D5). The second distance D2 may be substantially the same as the fourth distance D4 (D2=D4). In such an exemplary embodiment of the present invention, the first and fifth distances D1 and D5 may be greater than the second and fourth distances D2 and D4 (e.g., D2 and D4<D1 and D5). The third distance D3 may be 0.

The clamping portion 120 may be bilaterally symmetric. For example, the first branch portion 121a may have a substantially same shape as a shape of the fifth branch portion 121e. The second branch portion 121b may have a substantially same shape as a shape of the fourth branch portion 121d. For example, as described above, the first distance D1, which may be a distance at which the first branch portion 121a is spaced apart from the central line C, may be substantially the same as the fifth distance D5, which may be a distance at which the fifth branch portion 121e is spaced apart from the central line C (D1=D5). The second distance D2, which may be a distance at which the second branch portion 121b is spaced apart from the central line C, may be substantially the same as the fourth distance D4, which may be a distance at which the fourth branch portion 121d is spaced apart from the central line C (D2=D4). In addition, the first branch portion 121a may have a width substantially the same as a width of the fifth branch portion 121e (W1=W5). The second branch portion 121b may have a width substantially the same as a width of the fourth branch portion 121d (W2=W4). Accordingly, a tensile force may act uniformly on the right and left side of the division mask 100. Thus, the occurrence of waves in the division mask 100 may be reduced.

Each of the branch portions 121a, 121b, 121c, 121d, and 121e may have a smaller width further away from the center of the division mask 100. For example, the first, second, fourth, and fifth branch portions 121a, 121b, 121c, and 121d may have smaller widths than the width of the third branch portion 121c at the central line C of the division mask 100. The first branch portion 121a and the fifth branch portion 121e may have a smaller width than a width of the second branch portion 121b. The fourth branch portion 121d disposed more adjacent to the central line C of the division mask 100 may have a smaller width than a width of the first branch portion 121a and the fifth branch portion 121e. For example, the width W1 and W5 of the first branch portion 121a and the fifth branch portion 121e may be smaller than the width W2 and W4 of the second branch portion 121b and the fourth branch portion 121d. The width W3 of the third branch portion 121c may be the largest (e.g., W1 and W5<W2 and W4<W3). Accordingly, an area subjected to the tensile force increases at the central portion of the division mask 100 such that occurrence of a wave may be reduced.

Figure 7:
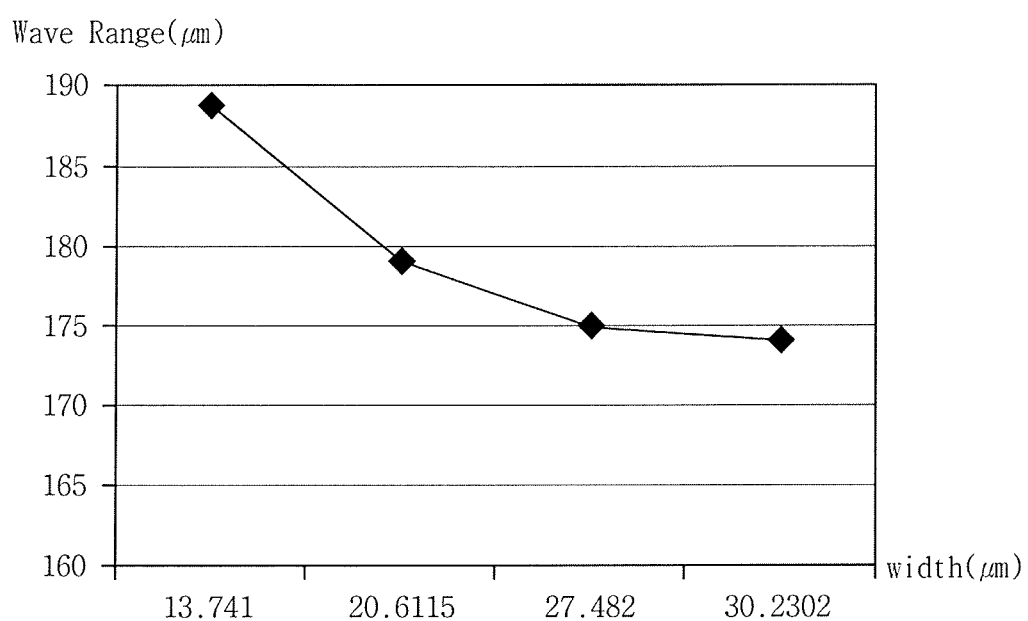
FIG. 7 is a view illustrating a result of wave measurement of the division mask according to an exemplary embodiment of the present invention.

FIG. 7 is a view illustrating a result of wave measurement of the division mask 100 according to an exemplary embodiment of the present invention.

Referring to FIG. 7, an X-axis may represent the width of the third branch portion 121c. A Y-axis may represent a wave range. The following Table 1 shows a minimum value of wave, a maximum value of wave, a wave range, and a wave reduction amount with respect to waves of a conventional mask in accordance with the width of the third branch portion 121c.

TABLE 1

|  | Conventional type | 1.5 times | 2 times | 2.2 times |
| --- | --- | --- | --- | --- |
| Width of third branch portion 121c (μm) | 13.741 | 20.6115 | 27.482 | 30.2302 |
| Minimum value | −92.2 | −87.9 | −84.8 | −84.7 |
| Maximum value | 96.6 | 91.2 | 90.3 | 89.4 |
| Wave range | 188.8 | 179.1 | 175 | 174.1 |
| Wave reduction amount to conventional wave |  | 9.7 | 13.8 | 14.7 |

Referring to Table 1, as the width of the third branch portion 121c increases, the minimum value of wave may increase and the maximum value of wave may decrease. Accordingly, as illustrated in FIG. 7, the range of wave generated in the division mask 100 may decrease as the width of the third branch portion 121c increases. Thus, as an area subject to the tensile force is increased in the central portion of the division mask 100, waves of the division mask 100 may be reduced.

Figure 8A:
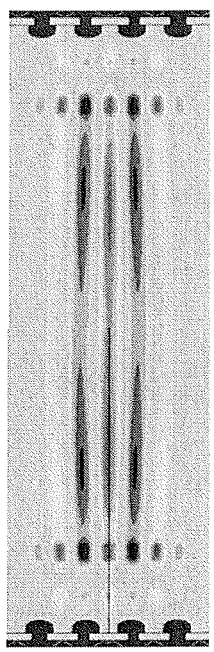
FIGS. 8A and 8B are views illustrating result of wave measurement of the division mask according to an exemplary embodiment of the present invention.
Figure 8B:

FIGS. 8A and 8B are views illustrating result of wave measurement of a division mask according to an exemplary embodiment of the present invention. FIG. 8A is a view illustrating a wave measurement result of a comparative example of a division mask represented in different colors according to the height of waves. FIG. 8B is a view illustrating a wave measurement result of a division mask that includes a third branch portion 121c having a width twice as large as a width of the comparative example of a division mask represented in different colors according to the height of waves.

As the height of a wave decreases, the wavelength of a color of the mask may be shortened. As the height of a wave increases, the wavelength of a color of the mask may be lengthened. Referring to FIGS. 8A and 8B, compared to the comparative example of a division mask, a wave may be reduced in the division mask including the third branch portion 121c having a wider width than that of the comparative example of a division mask.

According to an exemplary embodiment of the present invention, an occurrence of waves in the division mask may be reduced. Thus, weld defects of the mask frame assembly may be decreased and patterning accuracy may be increased.

In addition, a relatively thin division mask having a thickness of about 18 μm or less may be manufactured without an additional process.

From the foregoing, it will be appreciated that various exemplary embodiments in accordance with the present disclosure have been described herein for purposes of illustration, and that various modifications may be made without departing from the scope and spirit of the present teachings. Accordingly, the various exemplary embodiments disclosed herein are not intended to be limiting of the true scope and spirit of the present teachings. Various features of the above described and other embodiments can be mixed and matched in any manner, to produce further embodiments consistent with the invention.

What is claimed is:

1. A division mask, comprising:
a main body portion; and
a clamping portion disposed at opposite ends of the main body portion, the clamping portion comprising first to fourth branch portions,
wherein the first and fourth branch portions are outermost branch portions of the first to fourth branch portions, wherein the first and fourth branch portions each have a smaller width than each of the second and third branch portions, wherein the first, second, third and fourth branch portions all extend in a same direction as one another, wherein a side surface of the first branch portion and a first side surface of the main body portion are coplanar, and a side surface of the fourth branch portion and a second side surface, opposite to the first side surface, of the main body portion are coplanar, and
wherein the width of each of the branch portions extends along a direction perpendicular to an extension direction of each of the branch portions, wherein the extension direction is parallel to a length of the main body portion.

2. The division mask of claim 1, wherein the main body portion and the clamping portion each comprise a metal.

3. The division mask of claim 2, wherein the main body portion and the clamping portion each comprise an invar alloy.

4. The division mask of claim 1, wherein the clamping portion is bilaterally symmetric.

5. The division mask of claim 1, wherein the main body portion further comprises an opening pattern.

6. The division mask of claim 1, wherein the branch portions define a U-shaped groove.

7. The division mask of claim 1, further comprising a joint portion disposed between the clamping portion and the main body portion.

8. The division mask of claim 1, wherein each of the branch portions has a smaller width further away from the main body portion.

9. The division mask of claim 1, wherein the branch portions define a hemispherically shaped groove.

10. A division mask, comprising:
a main body portion comprising an opening pattern disposed along a longitudinal direction of the main body portion; and
a clamping portion disposed at opposite ends of the main body portion, the clamping portion comprising first to fourth branch portions,
  wherein the first and fourth branch portions are outermost branch portions of the first to fourth branch portions, wherein the first and fourth branch portions each have a smaller width than each of the second and third branch portions, wherein the first, second, third and fourth branch portions all extend in a same direction as one another, wherein a side surface of the first branch portion and a first side surface of the main body portion are coplanar, and a side surface of the fourth branch portion and a second side surface, opposite to the first side surface, of the main body portion are coplanar,
  wherein the width of each of the branch portions extends along a direction perpendicular to an extension direction of each of the branch portions, wherein the extension direction is parallel to a length of the main body portion, and
  wherein the clamping portion is bilaterally symmetric.

11. The division mask of claim 10, wherein the first to fourth branch portions define a U-shaped groove.

12. The division mask of claim 10, wherein the main body portion and the clamping portion each include a metal.

13. The division mask of claim 10, further comprising a joint portion disposed between the main body portion and the clamping portion.

14. A division mask, comprising:
a main body portion;
a clamping portion disposed at opposite ends of the main body portion, the clamping portion including a plurality of branch portions including first to fourth branch portions,
  wherein the first and fourth branch portions are outermost branch portions of the first to fourth branch portions, wherein the first and fourth branch portions each have a smaller width than each of the second and third branch portions, wherein the first, second, third and fourth branch portions all extend in a same direction as one another, wherein a side surface of the first branch portion and a first side surface of the main body portion are coplanar, and a side surface of the fourth branch portion and a second side surface, opposite to the first side surface, of the main body portion are coplanar, and
  wherein the width of each of the branch portions extends along a direction perpendicular to an extension direction of each of the branch portions, wherein the extension direction is parallel to a length of the main body portion.

15. The division mask of claim 14, wherein the plurality of branch portions define a U-shaped groove.

16. The division mask of claim 14, further comprising a joint portion disposed between the clamping portion and the main body portion.

17. The division mask of claim 1, wherein the second branch portion is disposed between the first branch portion and a central line.

18. The division mask of claim 1, wherein a central line extends parallel to the length of the main body portion.

19. The division mask of claim 18, wherein the second branch portion is disposed between the outermost branch portions and is adjacent to the central line.

* * * * *